United States Patent
Pan et al.

[11] Patent Number: 5,947,764
[45] Date of Patent: Sep. 7, 1999

[54] CONNECTOR ASSEMBLY WITH A CONNECTING MEANS TO BOARD AND ARRANGING METHOD FOR THE SAME

[75] Inventors: Hua-Tsong Pan, Taipei; Yu-Ming Ho, Taipei Hsien; Chu-Mei Chen, Taipei, all of Taiwan

[73] Assignee: Hon Hai Precision Ind. Co., Ltd., Taipei Hsien, Taiwan

[21] Appl. No.: 08/986,462

[22] Filed: Dec. 8, 1997

Related U.S. Application Data

[63] Continuation-in-part of application No. 08/619,348, Mar. 21, 1996, abandoned.

[51] Int. Cl.[6] .................................................. H01R 9/07
[52] U.S. Cl. .............................. 439/492; 439/67; 439/82
[58] Field of Search ........................... 439/67, 65, 77–78, 439/80, 492, 493, 541.5, 607–610, 92, 95, 108

[56] References Cited

U.S. PATENT DOCUMENTS

| | | | |
|---|---|---|---|
| 4,894,015 | 1/1990 | Stockero et al. | 439/67 |
| 5,123,851 | 6/1992 | Young et al. | 439/67 |
| 5,163,836 | 11/1992 | Young et al. | 439/67 |
| 5,194,010 | 3/1993 | Dambach et al. | 439/79 |
| 5,324,204 | 6/1994 | Lwee | 439/64 |
| 5,330,365 | 7/1994 | Leeson | 439/77 |
| 5,334,046 | 8/1994 | Brouillette et al. | 439/540 |
| 5,364,275 | 11/1994 | Ota et al. | 439/65 |
| 5,752,851 | 5/1998 | Zaderej et al. | 439/493 |

*Primary Examiner*—Lincoln Donovan

[57] ABSTRACT

A connector assembly (10, 10') for receiving electrical cards seated on a rigid mother board (12, 12'), includes the plural electrical card connectors (20, 20'), a flexible printed circuit (50, 50') and a connecting means (30, 30') wherein the plural connectors (20, 20') further includes an insulative housing (26, 26') means receiving a plurality of contacts (24, 24') and a shell means (40, 40') integrally forming a plurality of terminal (44, 44') therewith. The flexible printed circuit board (50, 50') includes a plurality of holes (521, 521') formed adjacent to an end thereof and solderably connected with the terminals (44, 44') and the contacts (24, 24') of the connectors (20, 20'), and a plurality of printed pads (581, 581') formed adjacent to the other end thereof and electrically connected with a plurality of circuit pads (18, 18') formed on the rigid mother board (12, 12') by means of the connecting means (30, 30'). Since the electrical connection between the electrical card connectors (20, 20') and the rigid mother board (12, 12') only utilizes one flexible printed circuit board (50, 50') and one connecting means (30, 30'), the connector assembly (10, 10') can save more space on the rigid mother board (12, 12') and achieve a shorter electrical transmittal path.

8 Claims, 6 Drawing Sheets

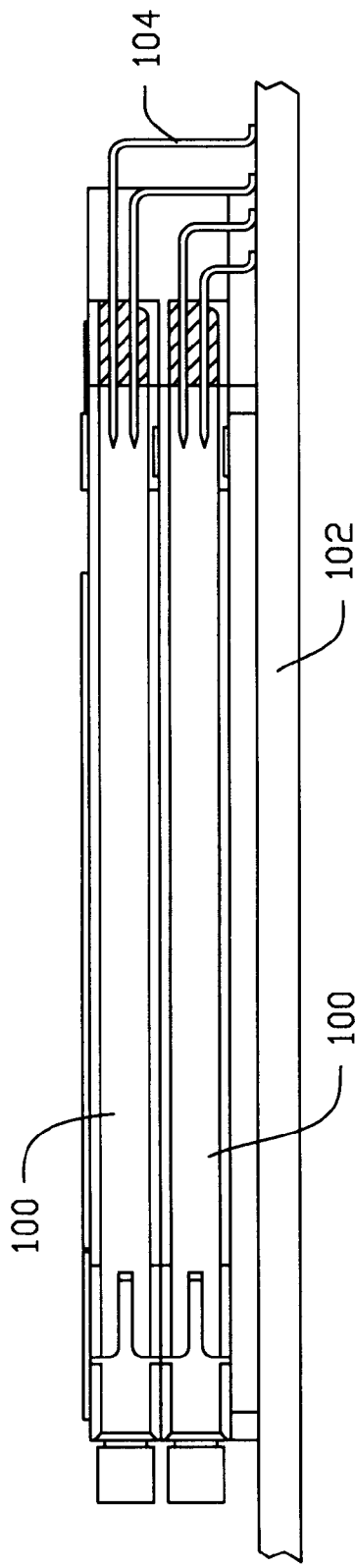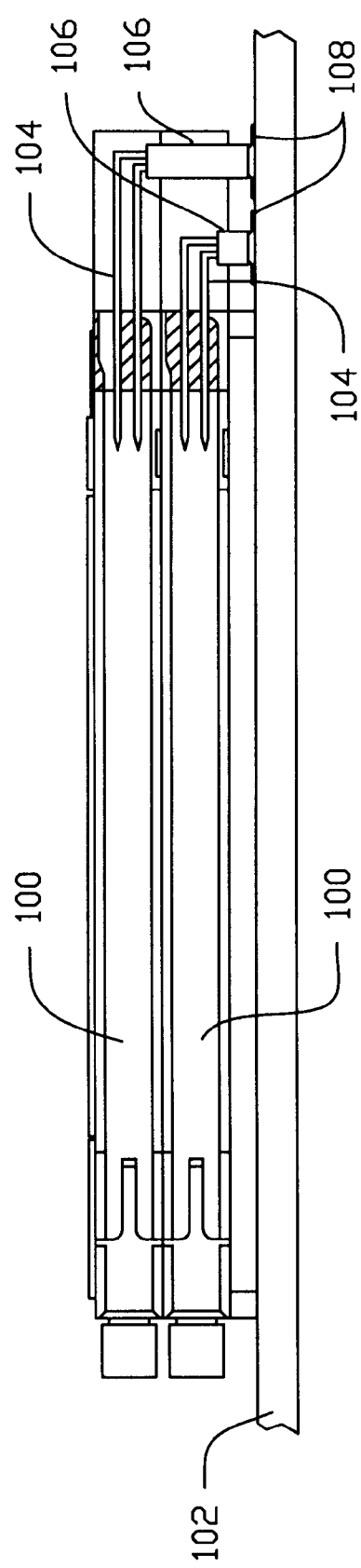
FIG.1 (PRIOR ART)
FIG.2 (PRIOR ART)

CONNECTOR ASSEMBLY WITH A CONNECTING MEANS TO BOARD AND ARRANGING METHOD FOR THE SAME

This application is a continuation-in-part of application Ser. No. 08/619,348 filed on Mar. 21, 1996, now abandoned.

FIELD OF THE INVENTION

The invention relates to a connector assembly for electrically connecting a plurality of electrical cards and a rigid mother board, and particularly a connector assembly with a connecting means occupying a reducing space on the rigid mother board.

THE PRIOR ART

Electrical card connectors are popularly used in the recent computer industry. As noted, most note book type computers include two electrical card connectors therein for receiving simultaneously two thinner electrical cards or solely receiving a thicker electrical card such as a card-like hard disk drive. One critical matter bothering the manufacturer, is how to efficiently surface-mounting solder the multiple rows of contact tails of the stacked electrical card connectors to the rigid mother board on which they are mounted.

FIG. 1 shows a prior art design using surface mounting arrangement for connecting two stacked electrical card connectors (100) to the rigid mother board (102) wherein the contact tails (104) of the connectors (100) are twice right-angle bent for having the ends of the contact tails (104) being coplanar on the rigid mother board (102). Unfortunately, controlling coplanarity of the contact tails (104) is not an easy job during manufacturing, especially for the upper row contacts.

FIG. 2 shows another prior art design using additional sockets (106) directly on the rigid mother board (102) on which the connectors (100) is seated wherein the first contact tails (104) are of a right angle type adapted to be inserted into the socket (106) for electrical and mechanical engagement with the second contacts (108) in the socket (106). The tails of the second contacts (108) are designedly soldered onto the rigid mother board (102). The disadvantages of this type also include the additional sockets (106) taking much space on the rigid mother board layout, and their tail soldering area being so compact that it is uneasy to inspect or repair the possible defective soldering between the tails of the second contacts (108) and the rigid mother board (102).

U.S. Pat. Nos. 5,324,204 and 5,334,046 also disclose the structures similar to the aforementioned second type. In addition, the flexible printed circuit (FPC) were also provided for connecting the contact tails of the connector(s) to the mother board, for example, U.S. Pat. Nos. 4,894,015, 5,123,851, 5,163,836, 5,194,010, 5,299,089 and 5,364,275. Meanwhile, some of the prior arts have a flexible printed circuit to be directly soldered onto the rigid mother board, but it is difficult to ensure an accurate soldering therebetween due to flexibility of the flexible printed circuit. Another prior art provides a connecting arrangement for electrically connecting the electrical card connectors and the rigid mother board, which consists of a flexible printed circuit, a zero insertion force connector, an adapter circuit board and a pair of mated vertical headers. So many assembles and connectors do not only spend a high cost and occupy more space on the rigid mother board, but also constitute a long electrical transmittal path between the electrical card connectors and the rigid mother board.

Accordingly, an object of the present invention is to provide a connector assembly with a flexible printed circuit and a connecting means which can easily and reliably connect the multiple rows contacts of the plural stacked connectors to the rigid mother board.

Another object of the present invention is to provide a connector assembly for saving space occupied thereby on the rigid mother board by only one connecting means and one flexible printed circuit.

Another object of the present invention is to provide a connector assembly having a plurality of stacked electrical card connectors for shortening electrical transmittal path between the electrical card connectors and the rigid mother board by means of only one connecting means and one flexible printed circuit thereof.

SUMMARY OF THE INVENTION

According to an aspect of the present invention, a connector assembly for electrically connecting a plurality of electrical cards and a rigid mother board, includes a plurality of stacked electrical card connectors, a flexible printed circuit (FPC) and a connecting means wherein the stacked connectors further includes an insulative housing means receiving a plurality of contacts, and a shell means integrally forming a plurality of terminal therewith. The flexible printed circuit board includes a plurality of holes formed adjacent to an end thereof and solderably connected with the terminals and the contacts of the stacked connectors, and a plurality of printed pads formed adjacent to the other end thereof and electrically connected with a plurality of circuit pads formed on the rigid mother board by means of the connecting means. Since the electrical connection between the electrical card connectors and the rigid mother board only utilizes one flexible printed circuit board and one connecting means, the connector assembly can save more space on the rigid mother board and achieve a shorter electrical transmittal path.

BRIEF DESCRIPTION OF THE DRAWINGS

FIG. 1 is a cross-sectional view of a prior art stacked electrical card connector assembly.

FIG. 2 is a cross-sectional view of another prior art stacked electrical card connector assembly.

DETAILED DESCRIPTION OF THE PREFERRED EMBODIMENT

Figure 3:
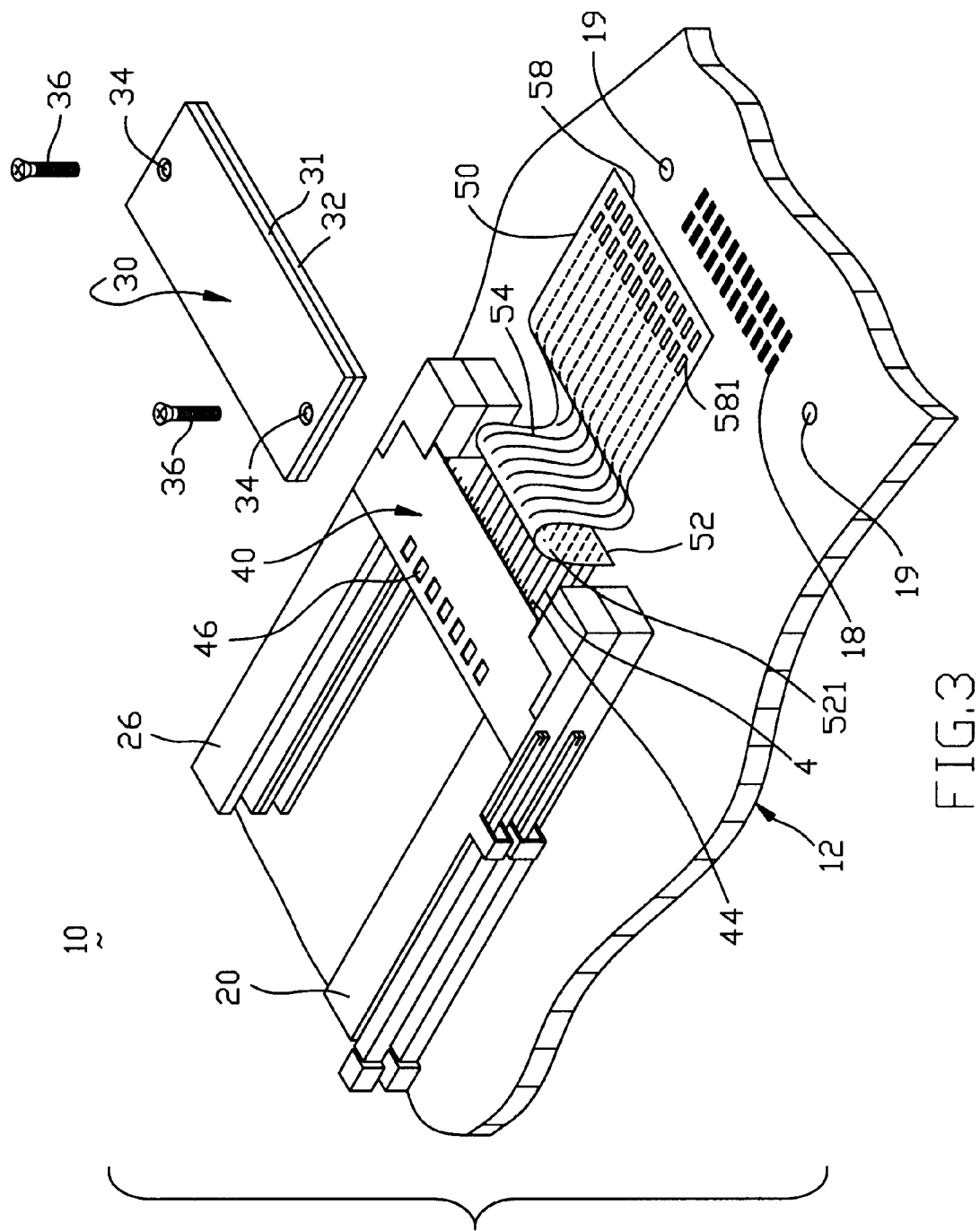
FIG. 3 is an exploded perspective view of a connector assembly in accordance with a first preferred embodiment of the present invention.

It will be noted here that for a better understanding, most of like components are designated by like reference numerals throughout the various figures in the embodiments. Attention is directed to FIG. 3, a first embodiment of the present invention, wherein a connector assembly (10) having a plurality of electrical card connectors (20) is seated on a rigid mother board (12) for receiving a plurality of electrical cards (not shown). The multiple-row first contacts (24) of the electrical card connectors (20) extend rearward from an insulative housing means (26) thereof. A conductive shell means (40) surrounds a rear end of the insulative housing means (26) which is close to an electrically mating position between the electrical cards and electrical card connectors (20) for constructing grounding protection thereto. The shell means (40) integrally forms therewith a plurality of terminals (44) extending outward and a plurality of spring fingers (46) extending inward to electrically engage with a conductive shell of an inserted electrical card (not shown).

The rigid mother board (12) includes two rows of spaced and juxtaposed circuit pads (18) which is close to the rear end of the housing (26) of the electrical card connectors (20). A pair of apertures (19) are respectively formed adjacent to opposite sides of the circuit pads (18) on the rigid mother board (12).

For electrical interconnection, a flexible printed circuit (50) utilizes an end (52) thereof including a plurality of through holes (521) to be solderably connected respectively with the first contacts (14) and the terminals (44) of the electrical card connectors (20). Oppositely, the other end (58) of the flexible printed circuit (50) including two rows of juxtaposed printed pads (581) for corresponding to the circuit pads (18) on the rigid mother board (12). A plurality of traces formed on a surface of flexible printed circuit (50) to connect the corresponding holes (521) and printed pads (581) for respectively transmitting grounding messages and signal messages therethrough.

Figure 4:
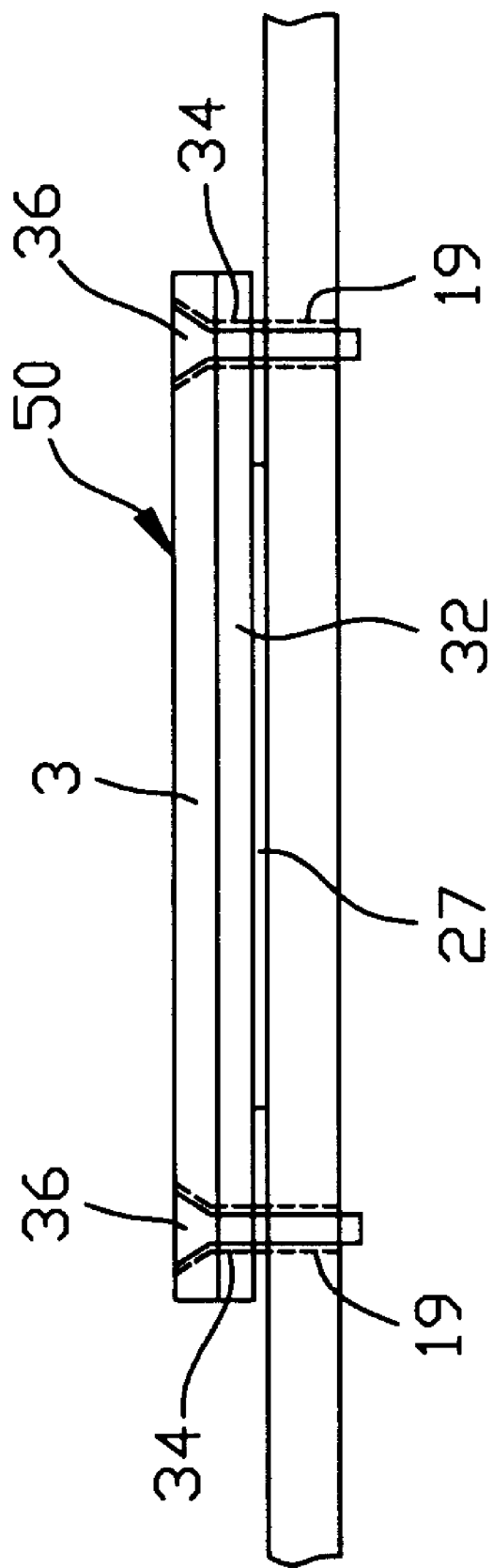
FIG. 4 is a front view of a connecting means of the connector assembly showing a flexible printed circuit retentively sandwiched between a lower elastic layer of connecting means and the rigid mother board by a pair of screws.

A connecting means (30) as shown in FIGS. 3 & 4 includes an upper rigid layer (31) and a lower elastic layer (32) integrally extending from a surface of the upper rigid layer (31) for avoiding the layers (31, 32) from sliding on each other along any directions. Furthermore, since the lower elastic layer (32) substantially extends from the full surface, a normal retentive force of the screws (36) acting on the flexible printed circuit board (50) is able to be completely balanced. A pair of screw holes (34) extends through both of the layers (31, 32) for cooperation with a pair of screws (36) to be retained together with a pair of apertures (19) formed on the rigid mother board (12).

In assembly, first, the end (58) of the flexible printed circuit board (50) is positioned on the rigid mother board (12) to electrically connect the printed pads (581) thereof with the circuit pads (18) of the rigid mother board (12) in alignment. Then the connecting means (30) is further positioned above the end (58) of the flexible printed circuit board (50) and tightly secured to the rigid mother board (12) by means of a pair of screws (36) to screw the holes (34) of both layers (31, 32) with the apertures (19) of the rigid mother board (12). Consequently, the end (58) of the flexible printed circuit board (50) can be retentively sandwiched between the mother board (12) and the lower elastic layer (32) of the connecting means (30) to maintain a reliable and good mechanical and electrical engagement therebetween. As a result, it is apparent that a shorter electrically transmittal path is achieved between the electrical card connector (20) and the rigid mother board (12) by means of only one flexible printed circuit board (50), and the connecting means (30) only approximately occupies a space above the circuit pads (18) on the rigid mother board (12) and is spaced to the electrical card connector (20) whereby the whole connector assembly (10) totally occupy a reduced space on the rigid mother board (12).

It is noted that, for resisting the concentrated forces around the screw region and dissipating such forces applied to the lower elastic layer (32), the lower elastic layer (32) provides the flexible printed circuit board (50) with a bumper function, which offers the equally sufficient pressing force against the flexible printed circuit board (50) to assure the reliable engagement between the printed pads (581) of the flexible printed circuit board (50) and the circuit pads (18) on the mother board (12).

Figure 5:
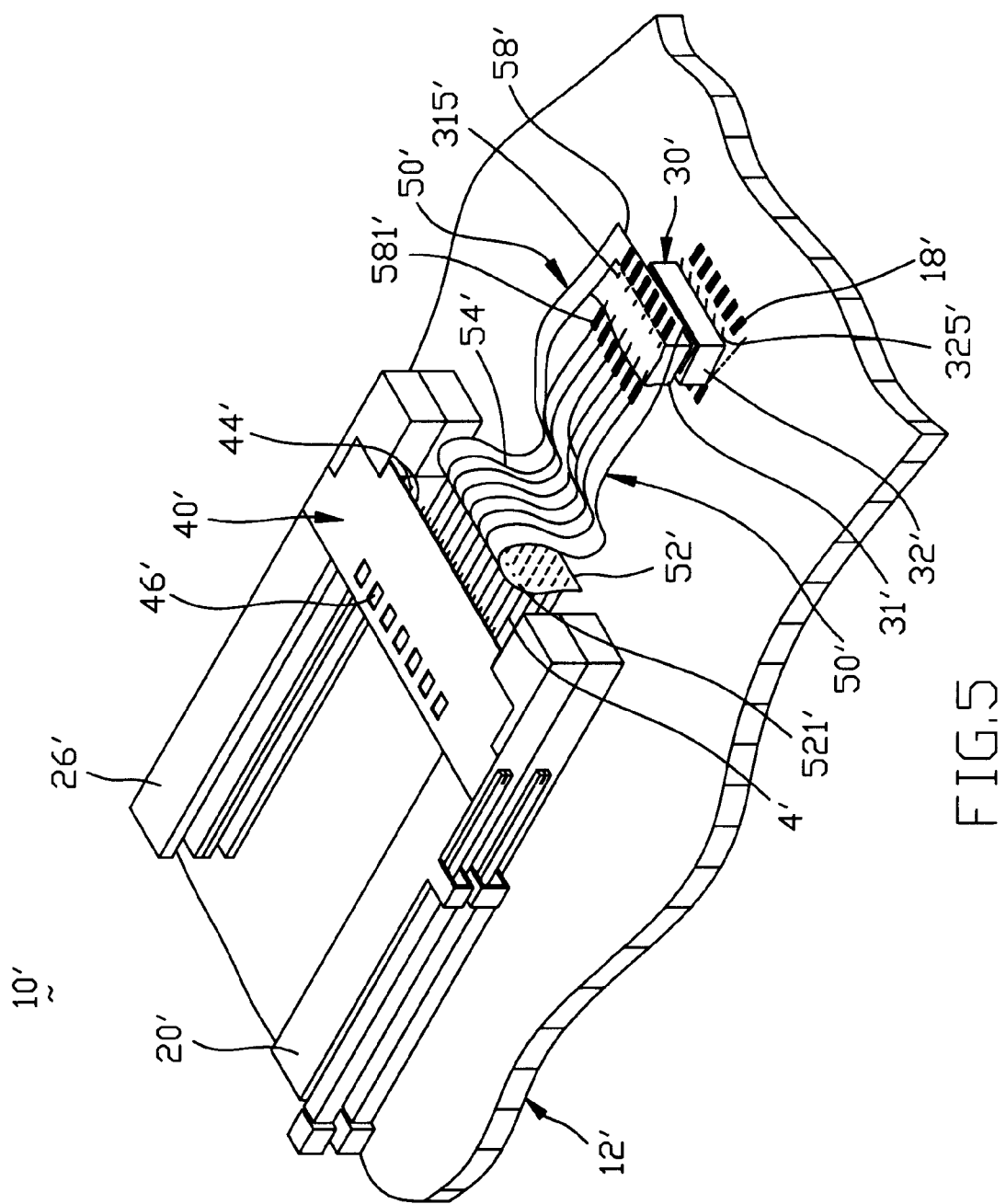
FIG. 5 is an exploded perspective view of a connector assembly in accordance with a second preferred embodiment of the present invention.
Figure 6A:
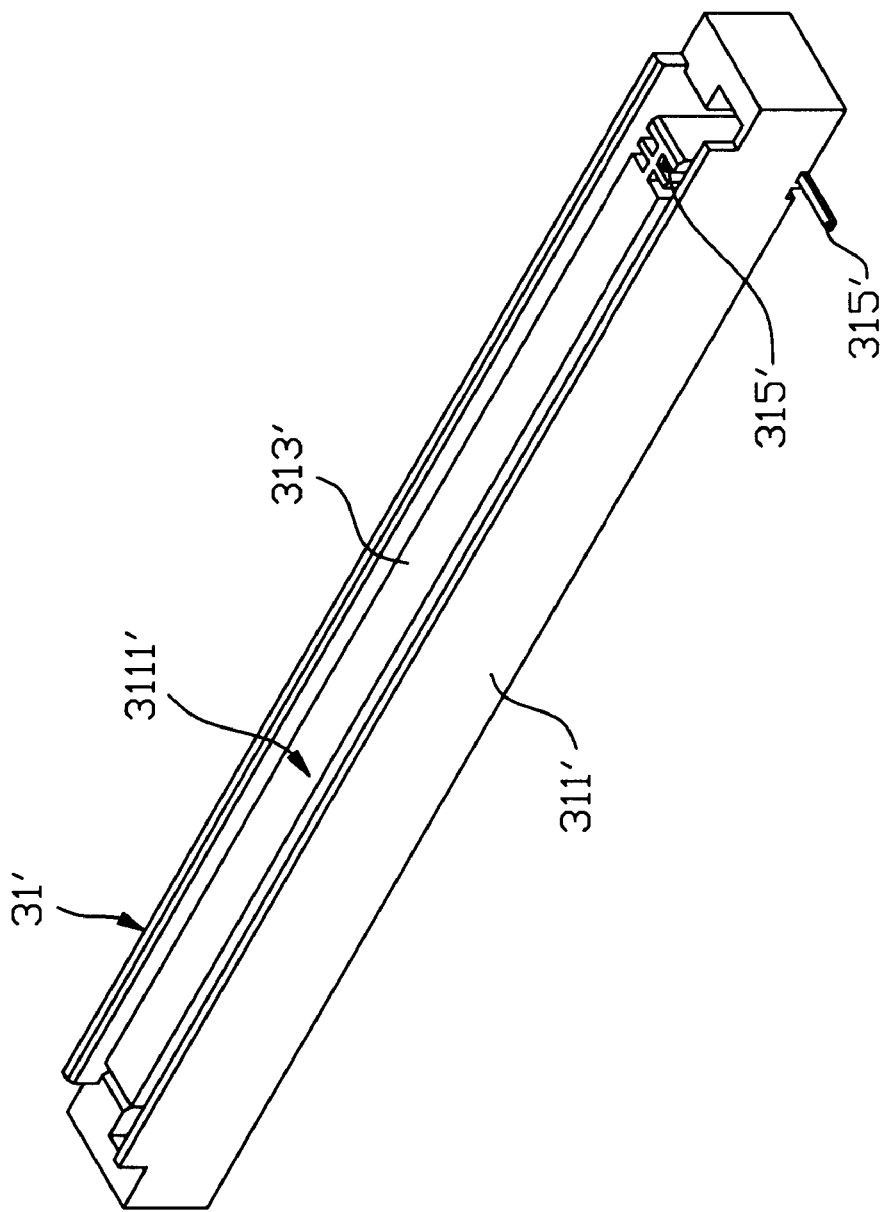
FIG. 6(A) is an enlarged perspective view of a first connecting device for use with the connector assembly in accordance with the second preferred embodiment of the present invention.
Figure 6B:
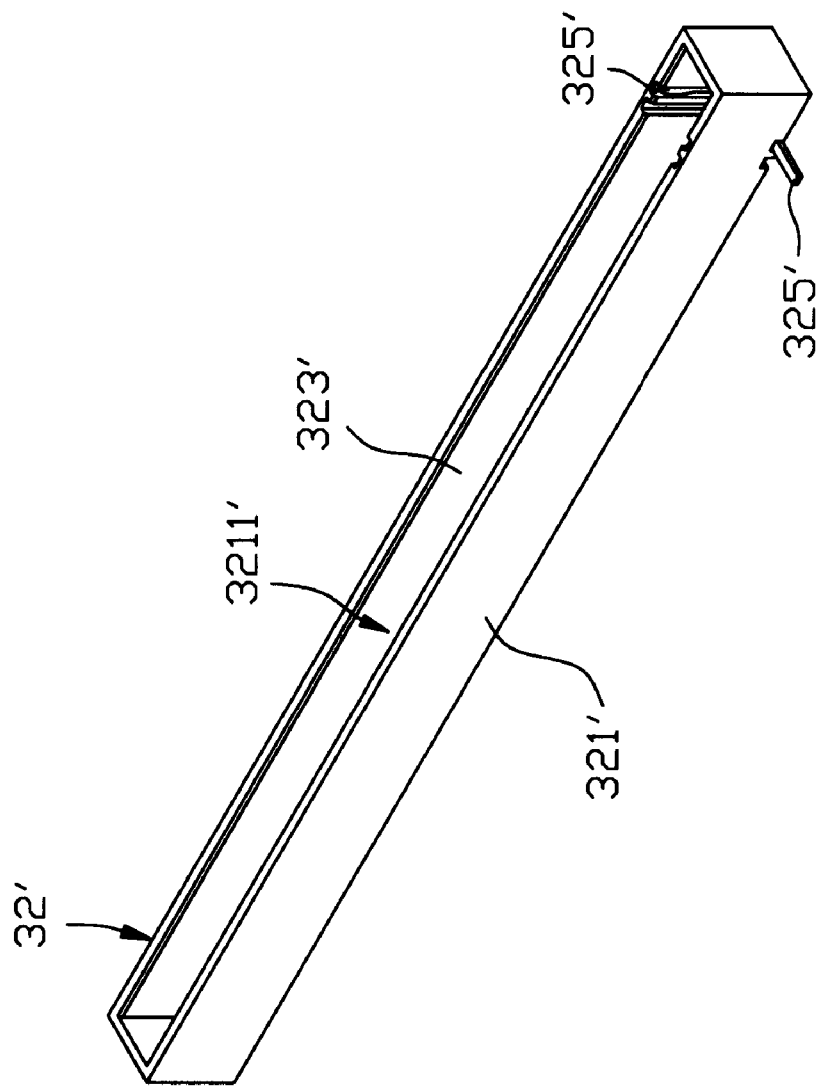
FIG. 6(B) is an enlarged perspective view of a second connecting device for use with the connector assembly in accordance with the second embodiment of the present invention.

In another preferred embodiment as shown in FIGS. 5, 6(A) & 6(B), most of the connector assembly (10') is similar to that of the first preferred embodiment. It is a only difference therebetween that the connecting means (30') of the second preferred embodiment mainly consists of a first connecting device (31') and a second connecting device (32'). The first connecting device (31') includes a first dielectric portion (311') with a first mating section (3111') which forms therein an elongated protrusion (313') arranged with a plurality of second contacts (315') (only one contact is shown in FIG. 6(A). The tails of the second contacts (315) extends outward for being solderably connected with the corresponding printed pads (581') of the flexible printed circuit board (50'). The second connecting device (32') includes a second dielectric portion (321') with a second mating section (3211') which forms therein an elongated cavity (323') arranged with a plurality of third contacts (325') (only one contact is shown in FIG. 6(B). The tails of the third contacts (325') extends outward for being solderably connected with the corresponding circuit pads (18') of the rigid mother board (12').

In assembly, the first connecting device (31') is stacked above the second connecting device (32'), by means of mating between the protrusion (313') of the first mating section (3111') and the cavity (323') of the second mating section (3211') thereof, to electrically connect the second contacts (315') and the third contacts (325'). However, since the whole connecting means (30') only occupies the area the second connecting device (32') occupies on the rigid mother board (12'), the connector assembly (10') can occupy a reduced space on the rigid mother board and achieve a shorter electrically transmittal as functioned in the first preferred embodiment.

while the present invention has been described with reference to specific embodiments, the description is illustrative of the invent and is not to be construed as limiting the invention. Various modifications to the present invention can be made to the preferred embodiments by those skilled in the art without departing from the true spirit and scope of the invention as defined by the appended claims.

Therefore, persons of ordinary skill in this field are to understand that all such equivalent structures are to be included within the scope of the following claims.

We claim:

1. An arrangement for electrically connecting a plurality of electrical connectors to a rigid mother board, comprising:

the electrical connectors seated above the rigid mother board, having insulative housing means disposed within a plurality of straight contacts extending outside the insulative housing means, and a conductive shell means located above the insulative housing means and integrally forming a plurality of terminals extending parallel to the straight contacts;

connecting means located above two rows of circuit pads formed on the rigid mother board;

a flexible printed circuit board having a plurality of holes defined at an end thereof, of which at least one solderably receives therein the corresponding terminal of the shell means and the remaining ones solderably receive respectively the straight contacts therein for electrical connection between the electrical connector and the flexible printed circuit board, and two rows of juxtaposed printed pads formed on an opposite end of the flexible printed circuit board, which directly engagingly incorporate the connecting means to electrically connect the circuit pads thereby shortened the electrically transmittal path between the electrical connectors and the rigid mother board, and reducing occupied space by the electrical connectors on the rigid mother board, and offering the electrical connectors with grounding protection via the electrical connection between the shell means and flexible printed circuit.

2. A connector assembly for receiving electrical cards seated on a rigid mother board, comprising:

insulative housing means disposed with a plurality of straight contacts extending outside the housing means;

conductive shell means located above one portion of the insulative housing means and integrally forming thereon a plurality of terminals extending parallel to the contacts;

a flexible printed circuit board having a plurality of holes formed on an end thereof, of which at least one solderably receives therein the corresponding terminal of the shell means and the rests solderably receive respectively the straight contacts therein for electrical connection between the electrical connector and the flexible printed circuit board, and a plurality of printed pads formed on an opposite end of the flexible printed circuit board;

connecting means including an upper rigid layer and a lower elastic layer integrally extending from one surface of the upper rigid layer for avoiding the layers from sliding on each other along any directions, and a pair of screw holes extending through both of the layers for cooperation with a pair of screws thereby retentively sandwiching the flexible printed circuit board between the lower elastic layer and rigid mother board, and positioning the printed pads of the flexible printed circuit board in accurate electrical engagement with a plurality of circuit pads formed on the rigid mother board.

3. The connector assembly as described in claim 2, wherein the shell means further integrally forms a plurality of spring fingers extending inward for electrical engagement with the inserted electrical card for constituting grounding protection.

4. The connector assembly as described in claim 2, wherein said flexible printed circuit board further forms thereon a plurality of traces connecting between the corresponding holes and printed pads to respectively transmit grounding messages and signal messages.

5. The connector assembly as described in claim 2, wherein said lower elastic layer integrally extends from the full surfaces of the upper rigid layer for balancing a retentive force of the screws acting on the flexible printed circuit board.

6. A connector assembly for receiving electrical cards seated on a rigid mother board, comprising:

insulative housing means disposed with a plurality of straight contacts extending horizontally outside the housing means;

conductive shell means located above one portion of the insulative housing means and integrally forming thereon a plurality of terminals extending parallel to the contacts;

a flexible printed circuit board having a plurality of holes formed on an end thereof, of which at least one solderably receives therein the corresponding terminal of the shell means and the remaining ones solderably receive respectively the straight contacts therein for electrical connection between the electrical connector and the flexible printed circuit board, and a plurality of printed pads formed on an opposite end of the flexible printed circuit board;

connecting means electrically connecting the connector assembly onto the rigid mother board, consisting of a first connecting device having a first dielectric portion and a plurality of second contacts solderably connected with the corresponding printed pads of the flexible printed circuit board, and a second connecting device having a second dielectric portion and a plurality of third contacts solderably connected with a plurality of circuit pads formed on the rigid mother board wherein the first connecting device is stacked above the second connecting device to electrically connected with each other reducing occupied space on the rigid mother board by the connector assembly and shortening electrically transmittal path between the electrical cards and the rigid mother board by means of cooperation between the flexible printed circuit board and the connecting means.

7. The connector assembly as described in claim 6, wherein the shell means further integrally forms a plurality of spring fingers extending inward for electrical engagement with the inserted electrical card for constituting grounding protection.

8. The connector assembly as described in claim 6, wherein said flexible printed circuit board further forms thereon a plurality of traces connecting between the corresponding holes and printed pads to respectively transmit grounding messages and signal messages.

* * * * *